(12) United States Patent
Johnson

(10) Patent No.: US 7,176,762 B2
(45) Date of Patent: Feb. 13, 2007

(54) RADIO FREQUENCY POWER AMPLIFIER

(75) Inventor: Paul A. Johnson, Kihei, HI (US)

(73) Assignee: Trex Enterprises Corp., San Diego, CA (US)

( * ) Notice: Subject to any disclaimer, the term of this patent is extended or adjusted under 35 U.S.C. 154(b) by 127 days.

(21) Appl. No.: 11/134,804

(22) Filed: May 20, 2005

(65) Prior Publication Data
US 2005/0258903 A1    Nov. 24, 2005

Related U.S. Application Data

(60) Provisional application No. 60/573,030, filed on May 20, 2004.

(51) Int. Cl.
*H03F 3/68* (2006.01)

(52) U.S. Cl. .................. 330/295; 343/754; 330/286

(58) Field of Classification Search ............... 330/295, 330/286; 343/754, 853
See application file for complete search history.

(56) References Cited

U.S. PATENT DOCUMENTS

| | | | | |
|---|---|---|---|---|
| 4,588,962 A | * | 5/1986 | Saito et al. ............... | 330/286 |
| 5,214,394 A | * | 5/1993 | Wong ........................ | 330/286 |
| 5,256,988 A | * | 10/1993 | Izadian ..................... | 330/295 |
| 5,329,248 A | * | 7/1994 | Izadian ..................... | 330/295 |

* cited by examiner

*Primary Examiner*—Robert Pascal
*Assistant Examiner*—Hieu Nguyen
(74) *Attorney, Agent, or Firm*—John R. Ross

(57) ABSTRACT

A radio frequency amplifier comprising a circuit board having a boundary shaped in the form of an ellipse and two dielectric layers, a first dielectric layer and a second dielectric layer, enclosed by conductive layers. Radio frequency signals are broadcasted from one of the two foci, the first focus, of the elliptically shaped circuit board through the first dielectric layer and separate portions of the signals are collected at the boundary of the first dielectric layer into a plurality of amplifier circuits. The collected portions are amplified separately in the amplifier circuits with radio frequency amplifiers and each of the amplifier circuits provides the same or approximately the same time delay of its collected signal. The amplified signal from each amplifier circuit is then combined with all other amplified signals in the second dielectric layer by broadcasting the amplified signal into the second dielectric layer at the boundary of the second dielectric layer at a location corresponding to the first dielectric layer boundary location at the input to the amplifier circuit. All of the amplified radio frequency signals combine constructively at the second focus of the elliptical circuit board and the output of the amplifier is extracted at this second focus. This structure has the advantages of being broadband, low-loss, and physically simple.

16 Claims, 5 Drawing Sheets

RADIO FREQUENCY POWER AMPLIFIER

This invention claims the benefit of Provisional Patent Application No. 60/573,030 filed May 20, 2004. This invention was conceived in the course of a contract (Contract Number DASG60-03-C-0008) with an agency of the United States and the Unites States government has rights in the invention.

This invention relates to radio frequency amplifiers and in particular to such amplifiers utilizing power combiners.

BACKGROUND OF THE INVENTION

It is often necessary to amplify radio frequency signals for communication, radar and other applications. Radio frequencies span a large section of the electromagnetic spectrum. In this application when we refer to radio frequency signals or RF signals, unless otherwise stated, we mean the portion of the electromagnetic spectrum between 300 MHz to 300 GHz. Many techniques are available to amplify radio frequency signals to achieve a higher power. Low cost integrated circuit amplifiers are available but these amplifiers typically will not operate properly at high power levels. Some amplifier techniques include power combiners using multiple relatively low power amplifiers. This power combining of multiple amplifier components has been achieved through several different approaches. For example: resistive splitter/combiners, coupled-line, traveling-wave, and quasi-optical (2-dimensional) to name a few. A particular example of a power divider/combiner using a wide-angle microwave lens is described in U.S. Pat. No. 5,329,248 which is incorporated herein by reference. However, structures for efficiently combining the output of multiple lower-powered devices can be quite large at frequencies lower than about 10 gigahertz (GHz), due to the wavelengths involved.

What is needed is a better high-power radio frequency amplifier.

SUMMARY OF THE INVENTION

The present invention provides a radio frequency amplifier comprising a circuit board having a boundary shaped in the form of an ellipse and two dielectric layers, a first dielectric layer and a second dielectric layer, enclosed by conductive layers. Radio frequency signals are broadcasted through the circuit board from one of the two foci, the first focus, of the elliptically shaped circuit board through the first dielectric layer and separate portions of the signals are collected at the boundary of the first dielectric layer into a plurality of amplifier circuits. The collected portions are amplified separately in the amplifier circuits with radio frequency amplifiers and each of the amplifier circuits provides the same or approximately the same time delay of its collected signal. The amplified signal from each amplifier circuit is then combined with all other amplified signals in the second dielectric layer by broadcasting the amplified signal into the second dielectric layer at the boundary of the second dielectric layer at a location corresponding to the first dielectric layer boundary location at the input to the amplifier circuit. All of the amplified radio frequency signals combine constructively at the second focus of the elliptical circuit board and the output of the amplifier is extracted at this second focus. This structure has the advantages of being broadband, low-loss, and physically simple.

At millimeter or microwave frequencies, the power combiner can be constructed of standard low loss printed circuit (PC) board materials with relatively low dielectric constants. For operation at lower frequencies, a high dielectric material is used to reduce the circuit size from several feet to several inches. The use of PC board material with high dielectric constant (greater than 80) allows multiple low-power amplifiers to be combined into a single high-power amplifier at relatively low frequencies with a simple, low-loss circuit, and the circuit to be fabricated on a PC board several inches across rather than several feet across.

DETAILED DESCRIPTION OF PREFERRED EMBODIMENTS

Amplifier with Elliptical Power Combiner

80 GHz Amplifier Unit

Figure 1:
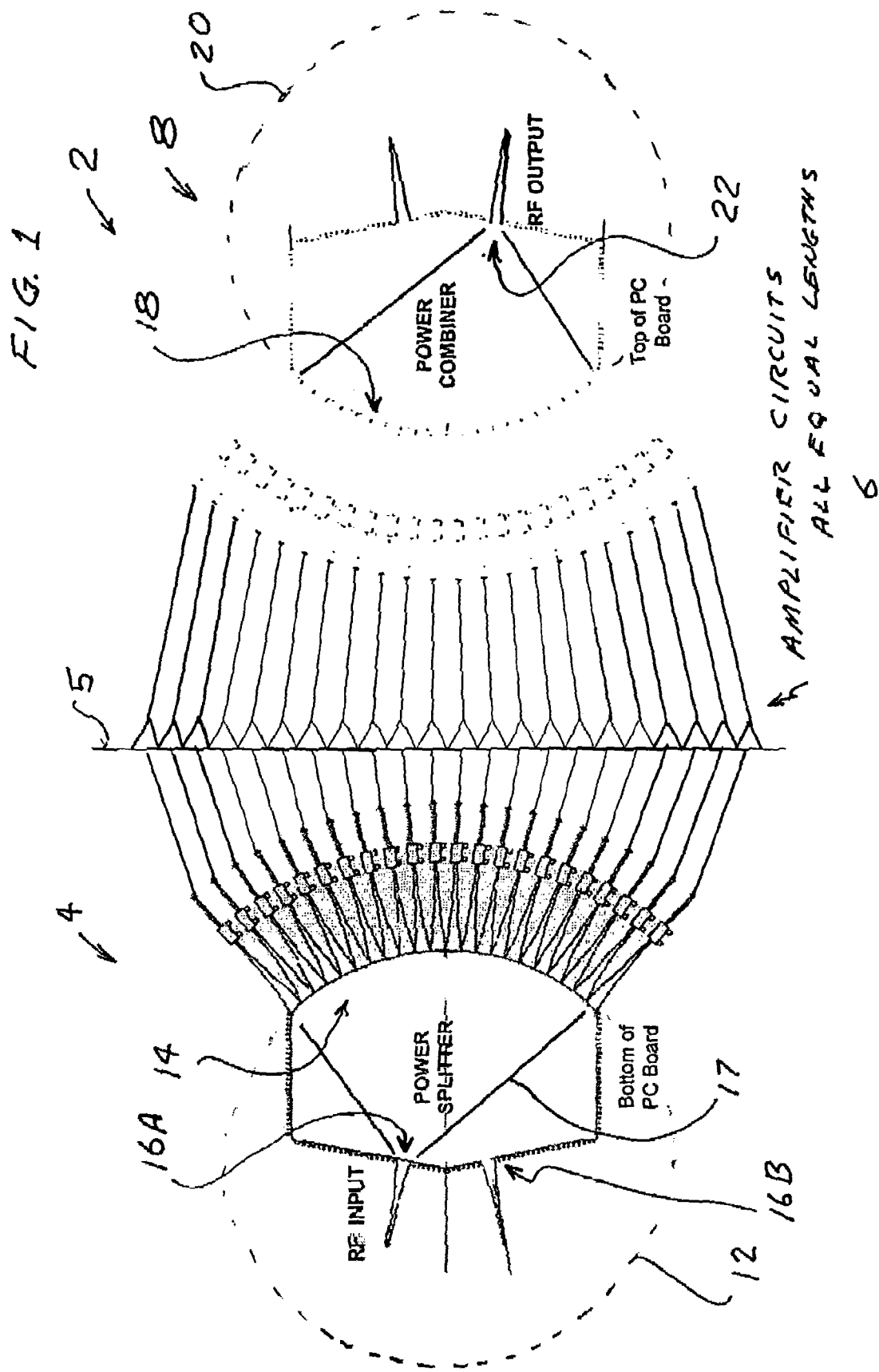
FIG. 1 is a drawing of a preferred embodiment of the present invention.
Figure 2:
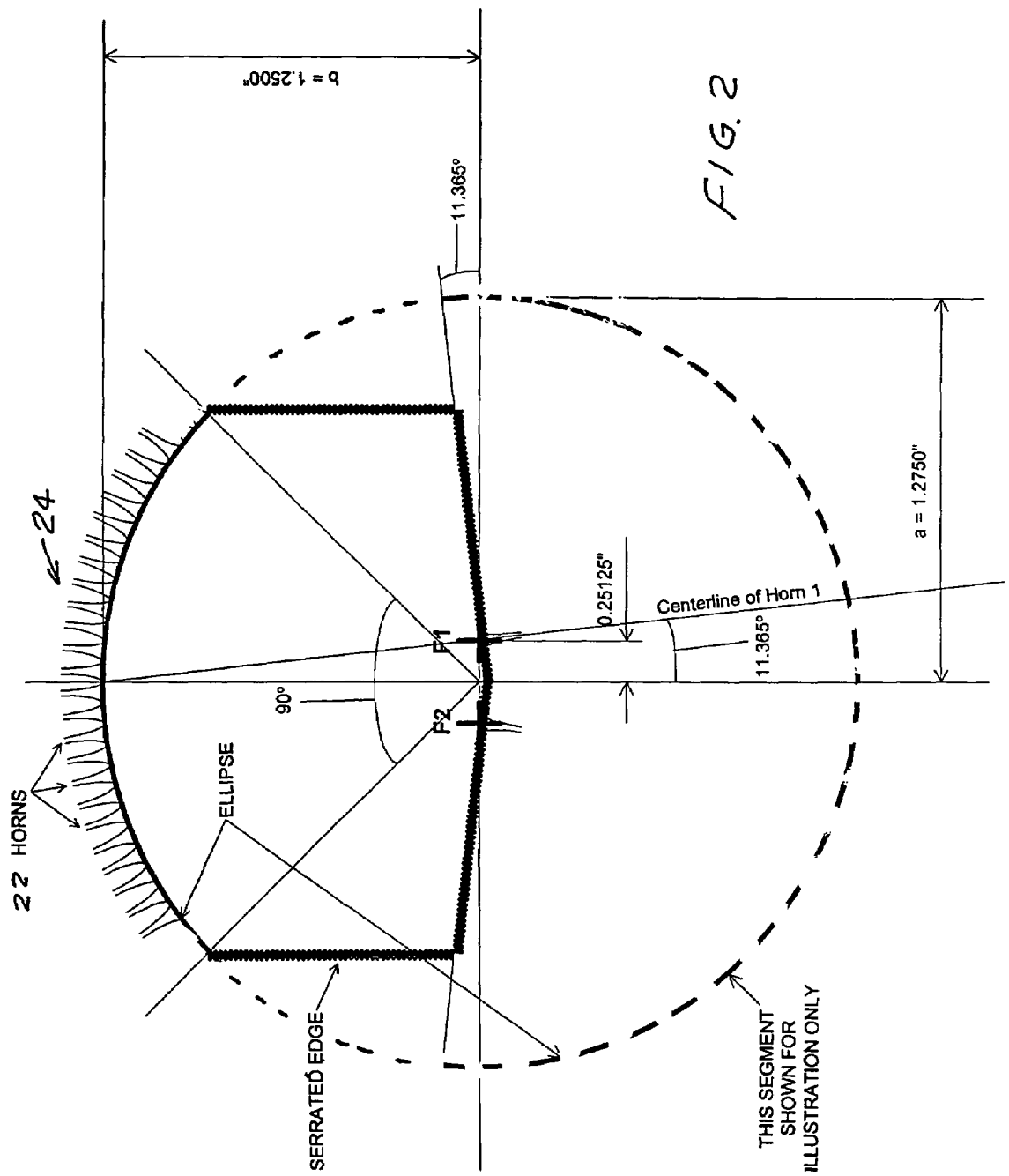
FIG. 2 shows important features of the above embodiment.

Applicants have developed an amplifier with a power combining structure that allows multiple individual amplifier channels to be combined efficiently and over a broad bandwidth. This structure has the advantages of being broadband, low-loss, and physically simple. A concept drawing of a first preferred embodiment of the present invention, an amplifier unit 2 is shown in FIG. 1. The unit is composed of a multi-layer circuit board with a power splitter 4 on a bottom side, and multiple amplifiers 6 and a power combiner 8 on a top side. The middle layer is a ground plane. This first preferred embodiment is fabricated for use at 80 GHz with PC board dielectric material having a dielectric constant $\in=3$ which yields a power combining structure approximately 2 inches across, and input/output 'horn' features approximately 0.1 inch across. The size of the power combiner, micro-strip transmission lines, and 'horns' is proportional to the square root of the dielectric constant of the PC board material that the structure is implemented in and inversely proportional to the frequency of operation. Conceptually, the RF input is first split by 22 ways to drive the 22 individual power amplifiers. The amplifiers are supplied by Raytheon Corporation, Andover, Mass. The 22 amplified RF signals are then recombined to produce a single amplified output signal. Two identical portions of an ellipse are defined by an ellipse with its two foci on the x axis, where the equation for the ellipse is $x^2/a^2 + y^2/b^2 = 1$, and where the distance from the origin to each focus is the square root of $a^2 - b^2$. The major radius a is 1.2750 inches and the minor radius b is 1.2500 inches as shown in FIG. 2. Dashed lines 12 show the shape of the bottom side ellipse, but as shown at 14 only about one-fourth of the boundary is used. The splitting of an input RF signal is performed by arraying the input circuits of 22 amplifiers along the portion 14 of the boundary of the bottom ellipse, and by providing the input at a focus 16A of the bottom ellipse. The second focus of ellipse 12 is shown at 16B. The power at the first focus input spreads out as shown at 17 and is delivered to the edge of the ellipse at 22 points along boundary 14, where the power is coupled to the other side of the board and amplified. The 22 amplification circuits are designed so that the signal transit times through each of the 22 amplification circuits are equal. The combining is performed by arraying the output circuits of 22 amplifiers along a portion 18 of the boundary of the top ellipse, the shape of which is shown by dashed line 20, which causes the output of all of the amplifier circuits to be constructively combined at focus 22, which is the power output point of the amplifier, and is on the opposite side of the circuit board from focus 16B.

Figure 5:
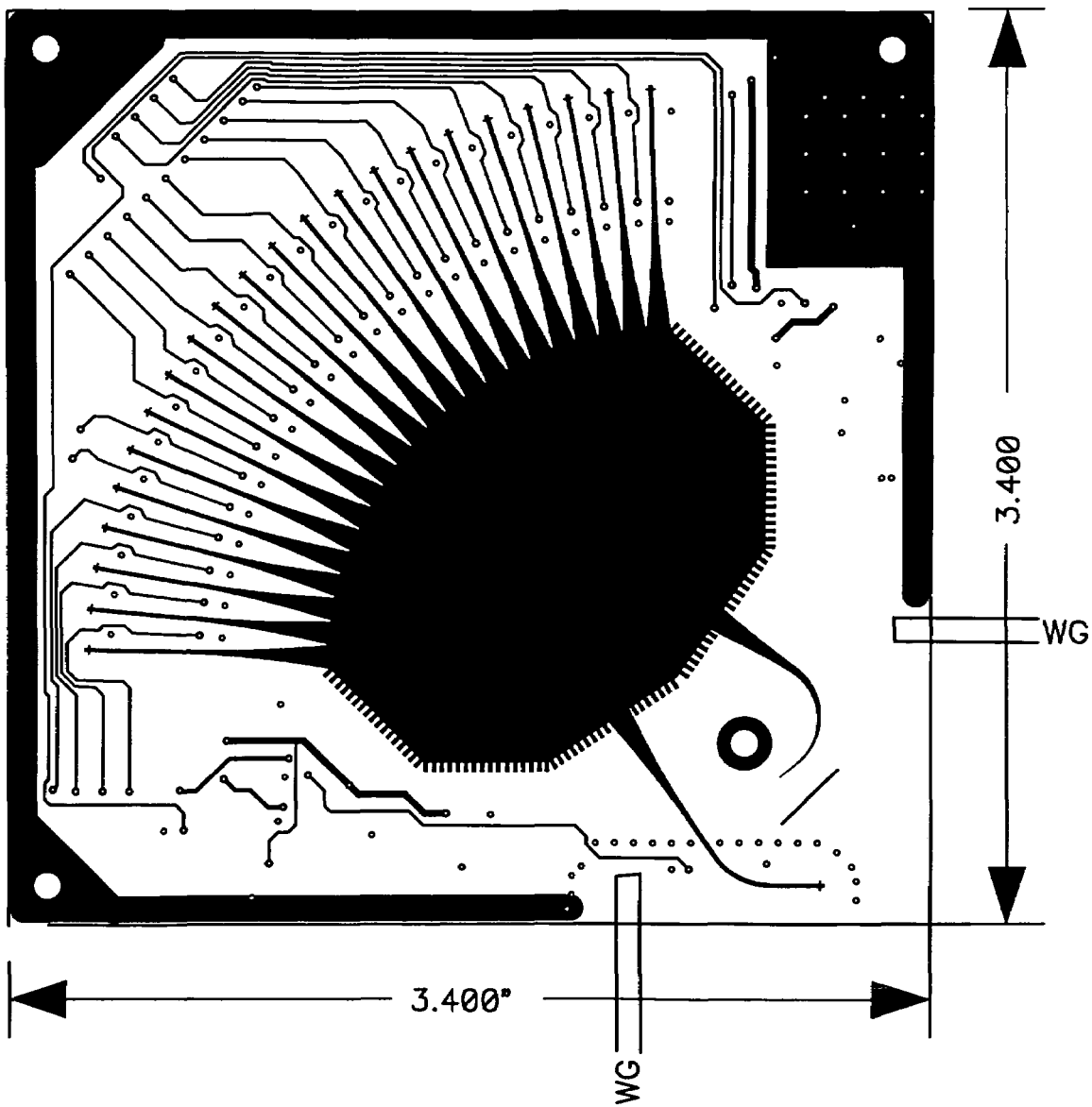
FIG. 5 shows the bottom side of a circuit board portion of the first preferred embodiment.
Figure 6:
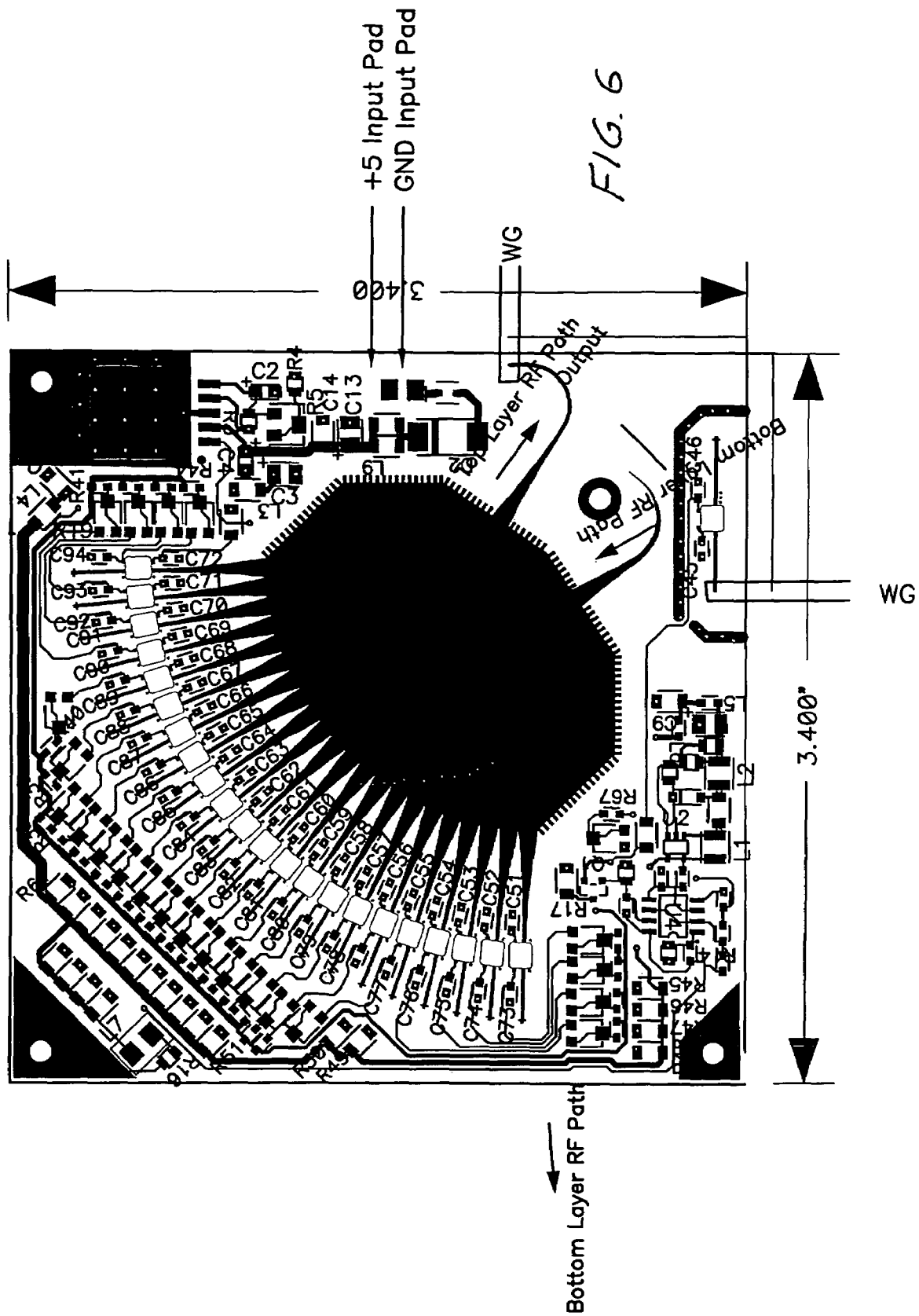
FIG. 6 shows the top side of a circuit board portion of the first preferred embodiment.

FIG. 5 shows the printed circuit pattern for the power splitter for the first preferred embodiment described above, and represents the bottom layer of the printed circuit board for operation of the amplifier at 80 GHz. FIG. 6 shows the top side of the printed circuit board, illustrating the amplifier circuits and the power combiner for the first preferred embodiment. The middle layer is a copper sheet.

A property of an ellipse (with its two foci) is that the total distance, from one focus to a reflection point on the boundary of the ellipse to the other focus, is the same regardless of where along the boundary the reflection point is located. This property of elliptical shapes (together with the equal transit times through the amplification circuits) causes the phase entering each amplifier to be non-equal, but at just the right phase to cause the waves to recombine at the second focus when exiting the amplifiers. So what happens is that the input is provided to the bottom side of a PC board at focus 16A of the bottom elliptical structure 12, and the output is on the top side of the PC board at focus 22 of ellipse 20 which is identical to ellipse 12. Focus 22 is at a location corresponding to the location of focus 16B on the bottom ellipse. The portion of FIG. 1 on the left side of the dividing line represents the power splitter portion 4 of the unit and the portion on the right side of dividing line 5 represents the amplifier 6 and combiner 8 portions of unit 2.

Amplification in the Range of 200 MHz to 2 GHz

The amplifier unit described above was developed for operation at 80 GHz. In order to use the power combining structure at frequencies between 200 and 2000 MHz, a PC board substrate with a dielectric constant of 80 or greater is desired, resulting in a size of approximately 16 inches across (at 2 GHz). The use of this design for very compact amplifier units for 200 MHz to 2 GHz frequencies is enabled by the availability of a PC board substrate material with very high dielectric constants in excess of 80. The use a material with a high dielectric constant allows the circuitry for the power combining structure to be fabricated in a device approximately 16 inches across, where it would otherwise be several feet across.

As described above, the power combiner structure fabricated for use at 80 GHz with PC board substrate material with a dielectric constant $\in=3$ yields a power combining structure approximately 2 inches across, and input/output 'horn' features approximately 0.1 inch across. The size of the power combiner, microstrip transmission lines, and 'horns' is inversely proportional to the square root of the dielectric constant of the PC board material that the structure is implemented in and inversely proportional to the frequency of operation. Using the same material (dielectric constant $\in=3$) as used for the 80 GHz power combiner at 2 GHz would result in a structure with a Diameter, D:

$$D \sim = (2 \text{ inches} \times 80 \text{ GHz})/(2 \text{ GHz}) = 80 \text{ inches}.$$

This large diameter is not practical for most applications. In order to reduce the 80" diameter of the power combiner to a more reasonable size, PC board substrate materials with higher dielectric constants can be used. The wavelength inside the material is proportional to the square root of the dielectric constant, so the size of the structure scales down as the dielectric constant increases. Alumina (a typical ceramic substrate) has a dielectric constant $\in=10$ and would yield a device (operating at 2 GHz) with Diameter, D:

$$D \sim = 80 \text{ inches/Square Root } [10/3] = 44 \text{ inches},$$

which is still quite large. Use of a material with dielectric constant $\in=80$ would yield a Diameter, D:

$$D \sim = 80 \text{ inches/Square Root } [80/3] = 15.5 \text{ inches},$$

which is more reasonably sized.

PC board materials with dielectric constant $\in=80$ are available from Coors and others, but the size of these substrate materials is typically limited to 4 inches×4 inches or less. Materials with $\in=300$ or greater are also available from other manufacturers, which would result in even more compact splitter/combiner structures.

Advantages of the Present Invention

The invention described here overcomes the transmitter bandwidth limitation imposed by tubes, and the weight and size limitations of current solid-state approaches. The invention offers the following advantages:

A significant increase in power;
Compact, high-density packaging;
Increased system reliability (gradual degradation with failed amplifiers);
High instantaneous bandwidth; and
Low dielectric materials can be used for GHz applications. Use of high dielectric constant (greater than 80) material for the power combiner structure allows the frequency of operation of the transmitter to be in the 200–2000 MHz range.

High Power Units

Figure 3:
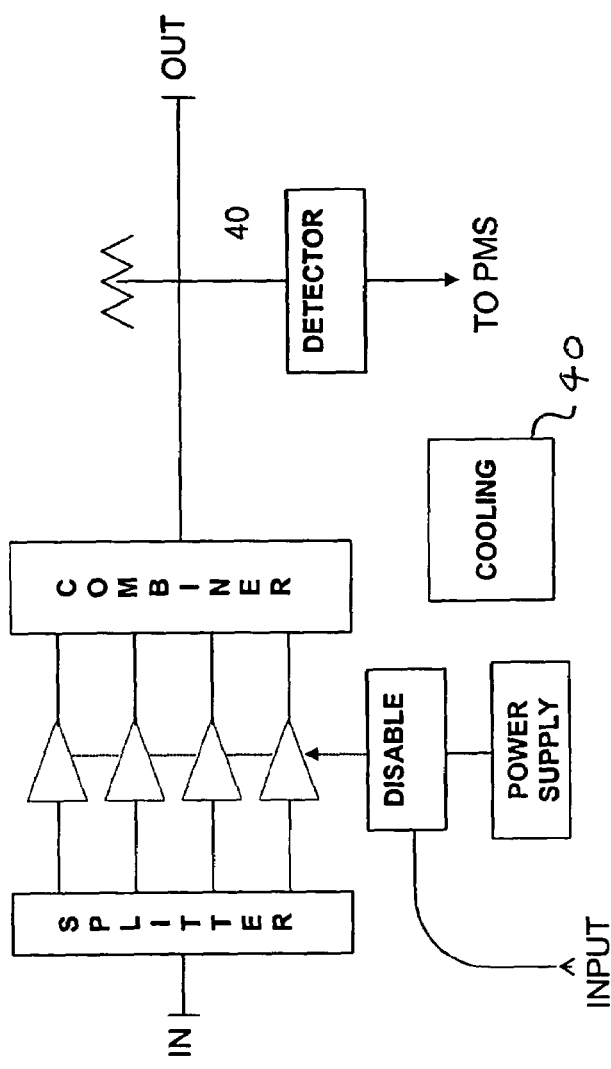
FIG. 3 is a block diagram of a preferred embodiment.
Figure 4:
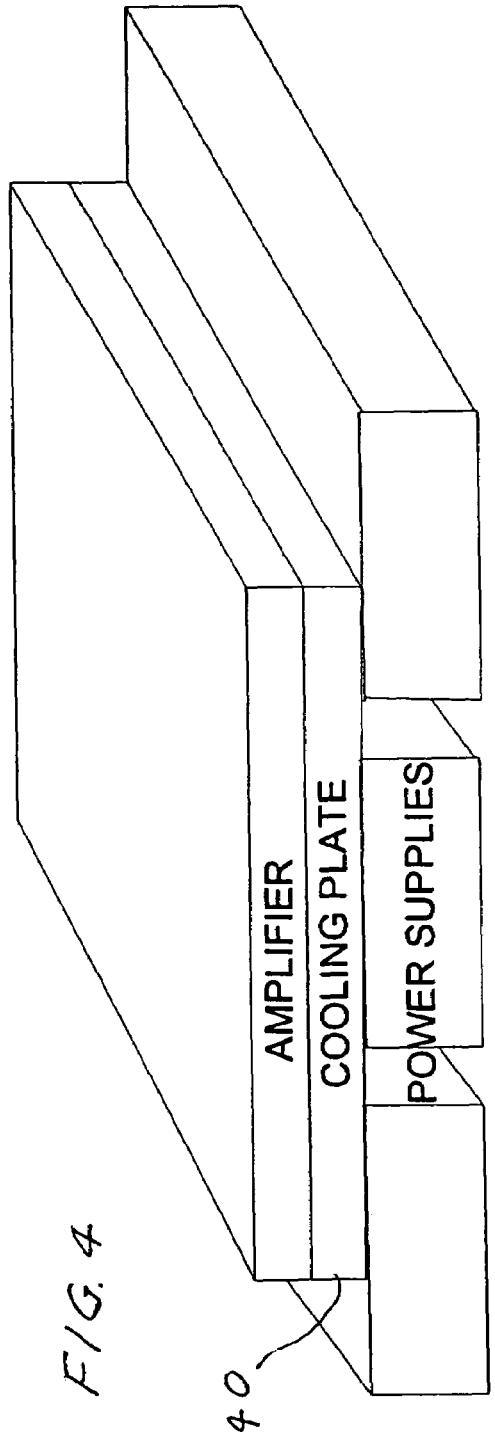
FIG. 4 shows mechanical features of the FIG. 3 embodiment.

For very high power amplifiers cooling is preferably provided. Amplifier units with cooling are described in FIGS. 3 and 4. These units are sometimes referred to as "gain blocks". A preferred embodiment of the invention provides a gain block that efficiently power combines several lower power, broadband amplifiers to yield a total power of greater than 1 kilowatt continuous wave (CW) over 300–2000 MHz. A block diagram of the basic approach is shown in FIG. 3 and a mechanical concept is shown in FIG. 4. Lateral diffusion metal on silicon (LDMOS) amplifier transistors are available from both Motorola and Cree that are capable of power levels of 100 watts CW. Applicants have performed preliminary explorations of broadband power amplifier designs based on new LDMOS and SiC transistors. Applicants believe that devices available from Cree, Sirenza, Rockwell, and Motorola should be able to achieve an operational bandwidth of 300–2000 MHz, with output powers up to 60 watts per device. Applicants have based the single channel amplifier design on the Cree CRF-24050-101 SiC FET. This device is specified for operation up to 2.7 GHz with a power gain of greater than 10 dB. It is also specified to tolerate a load mismatch of 10:1 VSWR. Operation of these devices in pulsed mode at much higher peak power is possible, since performance of the device is typically limited by junction temperature and heating. As long as the average power is kept low (and the junction temperature is kept low) the device can operate at high peak power. When needed cooling can be provided as shown at 40 in FIGS. 3 and 4. Cooling techniques include water cooling units and thermoelectric cooling units. In a preferred embodiment, Applicants propose to power combine 20 single-channel, 60-watt (output power) devices in a structure to yield a total output power greater than 1 kilowatt. As an alternative, more lower-wattage devices could be combined to yield the same output power.

APPLICATIONS

The invention described here has usefulness in a variety of applications where power over and above what can be achieved in a single device is desired. These applications include communications and radar at frequency ranges between 300 MHz to 300 GHz including: ultra-high frequencies (UHF—300 MHz to 3,000 MHz), microwave frequencies (1 GHz to 30 GHz), and millimeter-wave frequencies (30 GHz to 300 GHz), as well as other less common applications.

As indicated above, Applicants have performed preliminary testing of the power amplifier structure for a communications application at millimeter-wave frequencies between 70 and 90 GHz. At these frequencies, achieving RF power levels greater than a few tens of milliwatts can be difficult. In that application, 22 individual amplifiers, manufactured by Raytheon Corporation, Andover, Mass. can be power combined to produce an output power of approximately 400 milliwatts. In that application as described above, the elliptical power combiner structure is approximately 4 inches across. Achieving very high power, over a wide instantaneous bandwidth can also be difficult at UHF frequencies. In the preferred embodiment of the invention, described above, high output power at UHF frequencies can be achieved over a wide bandwidth. The wide operational bandwidth allows for very agile and high-resolution radars to be implemented at these frequencies, overcoming the bandwidth limitations of tube-based circuits.

Increased range, through increased power output, for X-band (approximately 10 GHz) radars can be achieved through the present invention. Single-chip amplifiers operating in the 10 GHz frequency band are presently available, and the output of the amplifiers can be efficiently and compactly combined using this approach.

In another application for terrestrial millimeter-wave communications, it is often desired to transmit the radio signal over ranges much greater than any single transmitter is capable of achieving (tens or hundreds of miles). In these cases, intermediate repeater stations are required, to receive and boost the signal power for retransmission to the next repeater station. The use of higher power amplifiers employing the technique described herein enables the use of fewer repeater stations to achieve the intended communications range.

While the above invention has been described in the context of specific embodiments, persons skilled in this art will recognize that many variations are possible. For example, instead of having the power combiner stacked on top of the power splitter as described in the text for the first embodiment, these two features could be side by side as indicated in the FIG. 1 drawing (disregarding the notes that they are stacked top and bottom). Care should be taken to assure that the ellipses are equivalent and as described above the transit times through the amplifiers need to be the same. Therefore, the scope of the present invention should be determined by the appended claims and not the specific examples that have been given.

What is claimed is:

1. A radio frequency amplifier comprising:
   A) a circuit board comprising two dielectric layers, each layer enclosed at least in part by conductive layers, said two dielectric layers defining:
      1) a first dielectric layer defining at least a portion of a first elliptical boundary and two foci defining a first focus and a second focus, and
      2) a second dielectric layer defining at least a portion of a second elliptical boundary and two foci defining a first focus and a second focus, said second elliptical boundary being geometrically equivalent to said first elliptical boundary;
   B) a plurality of radio frequency amplifier circuits, each circuit comprising a radio frequency amplifier and having an input at an input location on the first elliptical boundary of said first dielectric layer and an output at an output location on said second elliptical boundary of the second dielectric layer, said output location being at a location on said second elliptical boundary geometrically equivalent to said input location on said first elliptical boundary and each of said amplifier circuits having the same or approximately the same signal transit time;
   wherein,
   1) radio frequency signals broadcasted through the first dielectric layer from its first focus fan out in said first dielectric layer,
   2) separate portions of the signals are collected at the boundary of the first dielectric layer into the plurality of amplifier circuits and are amplified separately in the amplifier circuits,
   3) the amplified signal from each amplifier circuit is then combined with all other amplified signals in the second dielectric layer by being broadcasted into the second dielectric layer at the boundary of the second dielectric layer,
   4) all of the amplified radio frequency signals combine constructively at the second focus of the second dielectric layer and
   5) an output of the amplifier is extracted at this second focus.

2. The amplifier as in claim 1 wherein said second dielectric layer is located on top of said first dielectric layer on opposite sides of said circuit board and said second focus of said second dielectric layer is located above said second focus of said first dielectric layer.

3. The amplifier as in claim 2 wherein said dielectric material in said first and said second dielectric layer has a dielectric constant in the range of about 3.

4. The amplifier as in claim 1 wherein said dielectric material in said first and said second dielectric layer has a dielectric constant in the range of about 3.

5. The amplifier as in claim 1 wherein said amplifier is configured to amplify radio frequency signals in the millimeter wave frequency range.

6. The amplifier as in claim 5 wherein said amplifier is configured to amplify radio frequency signals in the frequency range of about 70 to 90 GHz.

7. The amplifier as in claim 6 wherein said amplifier is installed in an intermediate repeater station in a millimeter wave communication system.

8. The amplifier as in claim 1 wherein said amplifier is configured to operate at radio frequencies lower than millimeter wave frequencies.

9. The amplifier as in claim 8 wherein said dielectric constant of said dielectric material in both dielectric layers is substantially greater than 3.

10. The amplifier as in claim 8 wherein said dielectric constant of said dielectric material in both dielectric layers is substantially greater than 10.

11. The amplifier as in claim 8 wherein said dielectric constant of said dielectric material in both dielectric layers is in the range of 80 or greater.

12. The amplifier as in claim 1 and further comprising a cooling element.

13. The amplifier as in claim 12 wherein said cooling element is a thermoelectric cooling element.

14. The amplifier as in claim 12 wherein said cooling element is a water-cooled cooling element.

15. The amplifier as in claim 1 wherein said plurality of amplifier circuits is about 22 amplifier circuits.

16. The amplifier as in claim 1 wherein said plurality of amplifier circuits is more than 22 amplifier circuits.

* * * * *